United States Patent
Tsai et al.

(10) Patent No.: US 10,429,206 B2
(45) Date of Patent: Oct. 1, 2019

(54) COUNTING DEVICE AND PEDOMETER DEVICE

(71) Applicant: NUVOTON TECHNOLOGY CORPORATION, Hsinchu (TW)

(72) Inventors: Hsi-Jung Tsai, Hsinchu Science Park (TW); Cheng-Chih Wang, Hsinchu Science Park (TW); Chih-Wei Tsai, Hsinchu Science Park (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 15/671,656

(22) Filed: Aug. 8, 2017

(65) Prior Publication Data
US 2018/0058880 A1 Mar. 1, 2018

(30) Foreign Application Priority Data
Aug. 23, 2016 (TW) .............................. 105126953 A

(51) Int. Cl.
*G01C 22/00* (2006.01)
*G01L 1/16* (2006.01)
*H03K 21/10* (2006.01)
*H03K 3/037* (2006.01)
*H03K 19/20* (2006.01)

(52) U.S. Cl.
CPC .............. *G01C 22/006* (2013.01); *G01L 1/16* (2013.01); *H03K 21/10* (2013.01); *H03K 3/037* (2013.01); *H03K 19/20* (2013.01)

(58) Field of Classification Search
CPC ........ G01C 22/006; G01L 1/16; H03K 21/10; H03K 3/037; H03K 19/20
USPC .......................... 235/105; 368/200; 377/24.2
See application file for complete search history.

(56) References Cited

U.S. PATENT DOCUMENTS

| 4,461,582 A | * | 7/1984 | Walther | G04G 3/022 368/200 |
| 4,962,469 A | * | 10/1990 | Ono | G01C 22/006 235/105 |
| 2002/0113636 A1 | * | 8/2002 | Eliason | G11C 11/22 327/215 |
| 2013/0028368 A1 | * | 1/2013 | Oshio | A43B 3/0005 377/24.2 |
| 2015/0226574 A1 | * | 8/2015 | Takakura | G01C 22/006 377/24.2 |

* cited by examiner

*Primary Examiner* — Karl D Frech
(74) *Attorney, Agent, or Firm* — Muncy, Geissler, Olds & Lowe, P.C.

(57) ABSTRACT

A counting device and a pedometer device is described. The counting device includes: a piezoelectric sensor generating a voltage signal when pressed; a rectifier receiving the voltage signal and rectifying the voltage signal to produce a trigger signal; a non-volatile counter receiving the trigger signal, and including a plurality of non-volatile D flip-flops counting according to the trigger signal and storing count data; a processing module reading the count data and using the count data to generate a counting value; and a wireless communication module transmitting the counting value to an external device. The counting device is powered with electrical energy of the voltage signal generated by the piezoelectric sensor.

10 Claims, 7 Drawing Sheets

US 10,429,206 B2

COUNTING DEVICE AND PEDOMETER DEVICE

CROSS-REFERENCE TO RELATED APPLICATION

This application claims the benefit of Taiwan Patent Application No. 105126953, filed on Aug. 23, 2016, at the Taiwan Intellectual Property Office, the disclosure of which is incorporated herein in its entirety by reference.

BACKGROUND OF THE INVENTION

1. Field of the Invention

The present disclosure relates to a pedometer device. More particularly, the present disclosure relates to a pedometer device including a counting device using a non-volatile counter for counting a number of steps.

2. Description of the Related Art

In order to count a number of steps, some shoes have integrated within piezoelectric devices and pedometer devices disposed at bottoms thereof. When the user wears this kind of shoes to walk or run (hereinafter both verbs "walk" and "run" are simply denoted with the verb "walk"), the piezoelectric devices generate electrical energy when pressed, and the generated electrical energy is stored or provided to the pedometer device to count the number of steps.

However, in conventional design, the pedometer device is integrated within an insole of the shoe, so the counting function is limited to the particular shoe, and the user may not count the total number of steps for all day if the user wears different shoes in a day. Furthermore, the electrical energy generated by the piezoelectric material may be insufficient for operations of the memory, the controller, and real time clock, so the conventional pedometer device must include a battery to supply power. However, it is inconvenient for the user to replace the battery of the pedometer device integrated in the shoe.

SUMMARY OF THE INVENTION

An objective of the present disclosure is to provide a pedometer device which may be detachably disposed in a shoe or a sock and consume lower power.

In order to achieve the objective, the present disclosure provides a counting device including a piezoelectric sensor, a rectifier, a non-volatile counter, a processing module and a wireless communication module. The piezoelectric sensor generates a voltage signal when being pressed. The rectifier is electrically coupled to the piezoelectric sensor and configured to receive the voltage signal and rectify the voltage signal to a trigger signal. The non-volatile counter is electrically coupled to the rectifier and configured to receive the trigger signal, and includes a plurality of non-volatile D flip-flops which are configured to count according to the trigger signal and store count data. The processing module is electrically coupled to the non-volatile counter and configured to read the count data and calculate the count data to generate a counting value. The wireless communication module is electrically coupled to the processing module, and the processing module transmits the counting value to an external device through the wireless communication module. Electrical energy for operation of the counting device is provided by the voltage signal generated from the piezoelectric sensor.

Preferably, the plurality of non-volatile D flip-flops includes a first non-volatile D flip-flop and a second non-volatile D flip-flop. The first non-volatile D flip-flop includes a first clock terminal, a first input terminal, a first output terminal, a first inverting output terminal and a first non-volatile memory element. The first clock terminal is electrically coupled to the rectifier, and the first inverting output terminal is electrically coupled to the first input terminal. The second non-volatile D flip-flop includes a second clock terminal, a second input terminal, a second output terminal, a second inverting output terminal and a second non-volatile memory element. The second clock terminal is electrically coupled to the first inverting output terminal, and the second inverting output terminal is electrically coupled to the second input terminal. The first clock terminal receives the trigger signal, a first logic signal outputted from the first inverting output terminal is transmitted to the first input terminal and the second clock terminal, so that a first logic state of the first output terminal is changed correspondingly, and the first non volatile memory element stores the first logic state. The operation of the second non-volatile D flip-flop is determined according to the first logic signal outputted from the first inverting output terminal, and when the first logic signal is changed from a low logic level to a high logic level, the second inverting output terminal outputs a second logic signal which is then transmitted to the second input terminal, so that a second logic state of the second output terminal is changed and the second non-volatile memory element stores the second logic state.

Preferably, the count data is formed by the first logic state and the second logic state which represent different bits of the count data respectively.

Preferably, the non-volatile the counter may include a read-write control unit, and the rectifier may include a BOR circuit, and the first non-volatile D flip-flop may include a first read terminal and a first write terminal, and the second non-volatile D flip-flop may include a second read terminal and a second write terminal, the read-write control unit generates a read signal and a write signal according to a BOR signal from the BOR circuit, and the read signal is transmitted to the first read terminal and the second read terminal, so that the first output terminal is set to the first logic state stored in the first non-volatile memory element, and the second output terminal is set to the second logic state stored in the second non-volatile memory element. The write signal is transmitted to the first write terminal and the second write terminal, causing the first non-volatile memory element to store the first logic state of the first output terminal at the time, and control the second non-volatile memory element to store the second logic state of the second output terminal at the time.

According to an embodiment, the present disclosure is to provide a pedometer device including a tread portion and an accommodation portion. The tread portion is in a sheet-like structure and includes a piezoelectric sensor which is configured to generate a voltage signal when being pressed. The accommodation portion is in a sheet-like structure and connected with the tread portion, and includes a processing module, a memory and a wireless communication module. The processing module is electrically coupled to the piezoelectric sensor and the wireless communication module, and configured to receive the voltage signal, increase a counting value upon receipt of the voltage signal, store the counting value in the memory, and the transmit the counting value to an external device through the wireless communication module.

Preferably, the tread portion and the accommodation portion are disposed inside a shoe, and the tread portion is disposed in a position corresponding to a heel portion of the shoe, and the accommodation portion is bendably connected to the tread portion, and is bent upwardly relative to a sole of the shoe when being disposed on an inner lateral side of the shoe.

Preferably, the tread portion and the accommodation portion are disposed in a shoe, the tread portion is disposed in a position corresponding to a heel portion of the shoe, and the accommodation portion is disposed in a position corresponding to a foot arch portion of the shoe.

Preferably, the tread portion and the accommodation portion are fixed on a sock, the tread portion is fixed on a heel portion of the sock, and accommodation portion is bendably connected to the tread portion, and is bent upwardly relative to a bottom of the sock to be fixed on a lateral side of the sock.

Preferably, the tread portion and the accommodation portion are fixed on a sock, and the tread portion is fixed on a heel portion of the sock and the accommodation portion is fixed on a foot arch portion of the sock.

The counting device and the pedometer device of the present disclosure have at least one of following advantages:

First, the counting device and the pedometer device of the present disclosure use non-volatile D flip-flops to count the number of steps, thereby reducing power consumption effectively.

Secondly, the pedometer device of the present disclosure is designed to be in the sheet-like structure, in order to be detachable attached in the shoe or on the shoe easily.

BRIEF DESCRIPTION OF THE DRAWINGS

The structure, operating principle and effects of the present disclosure will be described in detail by way of various embodiments which are illustrated in the accompanying drawings.

DETAILED DESCRIPTION OF THE PREFERRED EMBODIMENTS

Figure 1:
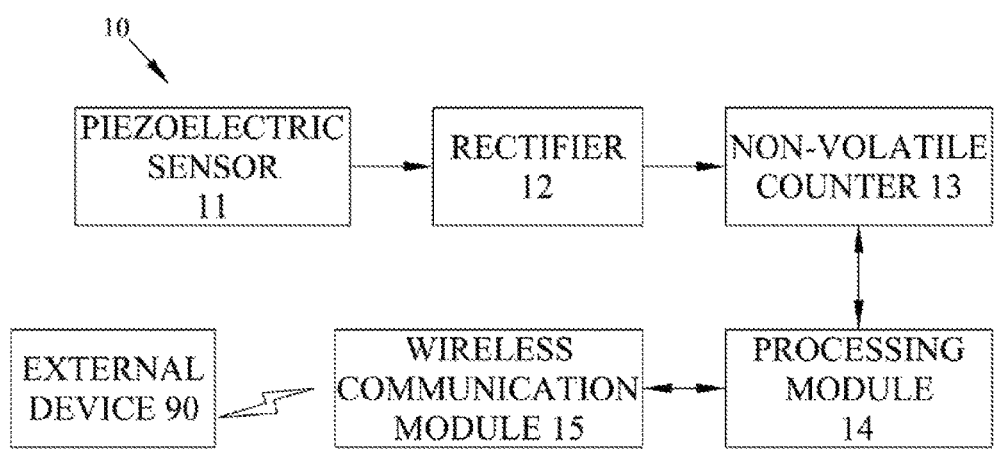
FIG. 1 is a block diagram of a counting device of the present disclosure.

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present invention. As used herein, the term "or" includes any and all combinations of one or more of the associated listed items.

Figure 2:
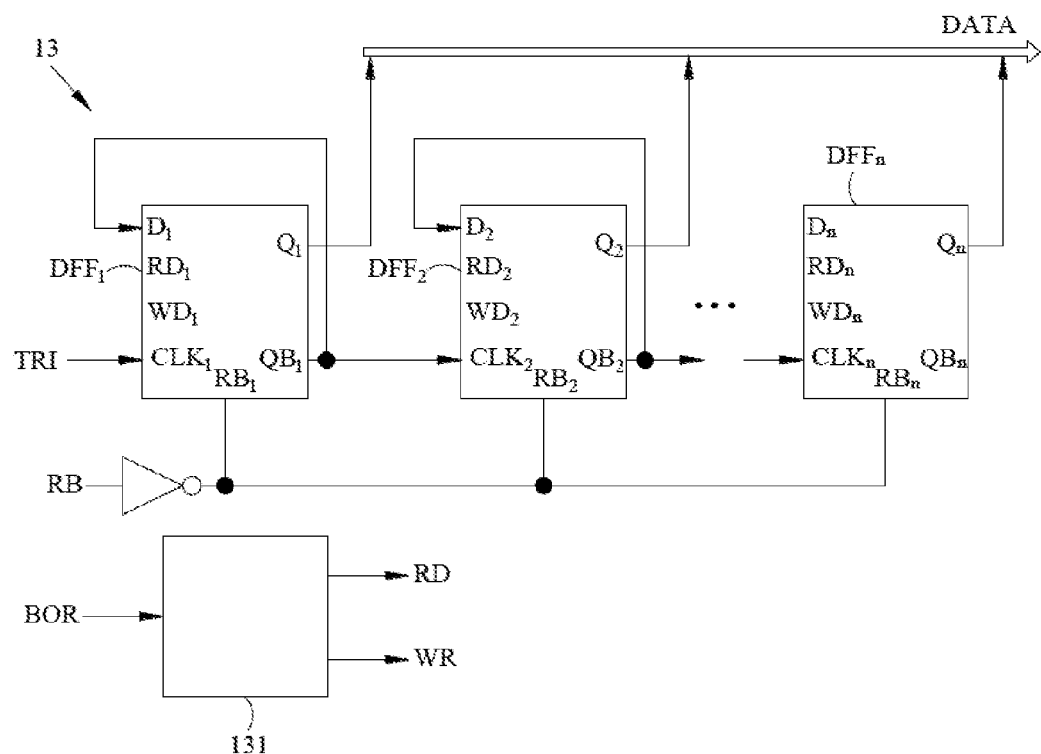
FIG. 2 is a block diagram of a non-volatile counter of the counting device of the present disclosure.
Figure 3:
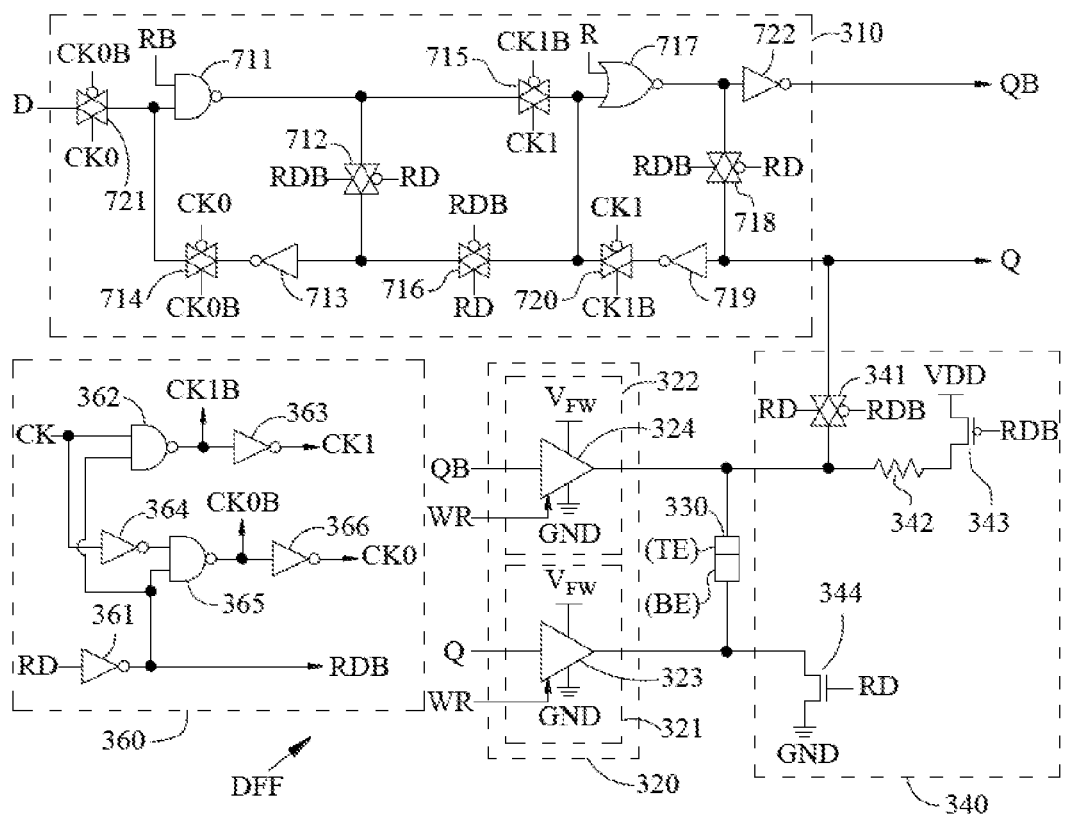
FIG. 3 is a circuit diagram of a non-volatile D flip-flop of the present disclosure.

The following refers to FIGS. 1 through 3, which respectively show a block diagram of a counting device of the present disclosure, a schematic view of a non-volatile counter of the counting device of the present disclosure, and a circuit block diagram of a non-volatile D flip-flop of the present disclosure.

As shown in FIG. 1, a counting device 10 of the present disclosure includes a piezoelectric sensor 11, a rectifier 12, a non-volatile counter 13, a processing module 14 and a wireless communication module 15.

The piezoelectric sensor 11, such as a piezoelectric patch, may generate piezoelectric effect subjected to an applied force, so that the piezoelectric sensor 11 generates a voltage signal when being pressed. The rectifier 12 is electrically coupled to the piezoelectric sensor 11 and configured to receive the voltage signal and rectify the voltage signal to generate and transmit a trigger signal TRI to the non-volatile counter 13 for counting.

The non-volatile counter 13 is electrically coupled to the rectifier 12 and configured to receive the trigger signal TRI. The non-volatile counter 13 includes a plurality of non-volatile D flip-flops DFF1 through DFFn which are configured to count according to the trigger signal TRI and then store the count data. The plurality of non-volatile D flip-flops DFF1 through DFFn are electrically coupled in series to perform the counting function of the non-volatile counter 13. After the non-volatile counter 13 receives the trigger signal TRI by one time, the count data stored in the non-volatile counter 13 is increased by one.

For a general D flip-flop, when the D flip-flop is not activated yet, the D flip-flop is back to an initial state without memory function. On the other hand, the non-volatile D flip-flop used in the present disclosure includes elements other than that of the generally D flip-flop, so even the non-volatile D flip-flop is not provided power, the non-volatile D flip-flop is able to store the last logic state while the non-volatile D flip-flop is providing power, that is, the non-volatile D flip-flop has the memory function. The non-volatile counter 13 uses the non-volatile D flip-flop to store the last count data after power supply is stopped, so that the non-volatile counter 13 can retain the last count state without consuming power, and after the piezoelectric sensor 11 is pressed again, the non-volatile counter 13 may receive power generated by the piezoelectric sensor 11 to accumulate the stored count data by one, thereby counting how many times the piezoelectric sensor 11 is pressed.

The processing module 14 is electrically coupled to the non-volatile counter 13 to read the count data stored in the non-volatile counter 13, and then calculates a count value according to the count data. The count data stored in the non-volatile counter 13 is in a logic form suitable for general electronic elements, and the processing module 14 calculates the count data to generate the count value recognizable for a user. Preferably, the processing module 14 may be a CPU, a MCU, a control chip, and so on, however, these examples are merely for exemplary illustration, and the present disclosure is not limited thereto. Preferably, the non-volatile counter 13 may be implemented inside the processing module, and may provide counting function and non-volatile memory function.

The wireless communication module 15 is electrically coupled to the processing module 14, and the processing module 14 may transmit the count value to an external device 90 through the wireless communication module 15, or receive a control signal from the external device 90 through the wireless communication module 15. Preferably, the wireless communication module 15 is in communication with the external device 90 by radio frequency identification (RFID) or near field communication (NFC) technology.

The piezoelectric sensor 11 is configured to generate the voltage signal which is used to increase count data stored in the non-volatile counter 13 and further provide power to elements of the counting device 10 for operation. For example, the counting device 10 may further include a capacitor to store electrical energy of the voltage signal, and the energy stored in the capacitor can be used to provide power to the non-volatile counter 13, the processing module 14 and the wireless communication module 15 for operation. For this reason, the counting device 10 of the present disclosure is not installed with a battery for supplying power.

As shown in FIGS. 2 and 3, the non-volatile counter 13 of the counting device 10 includes a plurality of non-volatile D flip-flops DFF1 through DFFn. For convenience in explanation, an operation between two non-volatile D flip-flops, such as the first non-volatile D flip-flop DFF1 and the second non-volatile D flip-flop DFF2, is taken as exemplary illustration.

The first non-volatile D flip-flop DFF1 includes a first clock terminal CLK1, a first input terminal D1, a first output terminal Q1, a first inverting output terminal QB1 and a first non-volatile memory element. The first clock terminal CLK1 is electrically coupled to the rectifier 12, and the first inverting output terminal QB1 is electrically coupled to the first input terminal D1.

The second non-volatile D flip-flop DFF2 includes a second clock terminal CLK2, a second input terminal D2, a second output terminal Q2, a second inverting output terminal QB2 and a second non-volatile memory element. The second clock terminal CLK2 is electrically coupled to the first inverting output terminal QB1, and the second inverting output terminal QB2 is electrically coupled to the second input terminal D2 and a clock terminal of next non-volatile D flip-flop. It is worth noting that the first non-volatile D flip-flop DFF1 has the same structure as the second non-volatile D flip-flop DFF2.

After the first dock terminal CLK1 receives the trigger signal TRI which is a transition from a low logic level to a high logic level, the first non-volatile D flip-flop DFF1 starts to operate, the first inverting output terminal QB1 outputs and transmits a first logic signal which may be logical "0" or logical "1", to the first input terminal D1 and the second clock terminal CLK2. The following describes the function of the non-volatile D flip-flop of the non-volatile counter 13.

The output terminal of the non-volatile D flip-flop is coupled to the input terminal of the non-volatile D flip-flop, so a logic state of the output terminal is the same as that of the input terminal; a logic state of the inverting output terminal is inverse of that of the output terminal; the logic state stored in the non-volatile memory element is the same as that of the output terminal. The logic state of a first logic signal outputted from the first inverting output terminal QB1 is inverse of that of the first input terminal D1 and the first output terminal Q1. As a result, after the first logic signal is transmitted to the first input terminal D1, the first logic states of the first input terminal D1 and the first output terminal Q1 both are changed, for example, the first logic state may be changed from logic "0" to logic "1", or from logic "1" to logic "0". At the same time, the first non-volatile memory element stores the first logic state the same as that of the first output terminal Q1.

In greater detail, each non-volatile memory element stores a logic state which is changed between logic "0" and logic "1" according to the logic state of the output terminal, that is, single non-volatile memory element does not accumulate the logic state. Because of having non-volatile memory characteristic, the non-volatile D flip-flop retains the last logic state before power supply is stopped, and the output terminal of the non-volatile D flip-flop returns to the last logic state after the power is supplied again. After the non-volatile D flip-flop is turned on again, the logic state stored in the non-volatile memory element is read to make the logic state of the output terminal of the non-volatile D flip-flop the same as that of the non-volatile memory element.

For example, when the first logic signal outputted from the first inverting output terminal QB1 is logic "1", the first input terminal D1 receives the first logic signal and changes the first logic state thereof from logic "0" to logic "1" and the first logic state of the output terminal Q1 is then change from logic "0" to logic "1". As a result, the first non-volatile memory element stores the first logic state as logic "1", vice versa.

Furthermore, operation of the second non-volatile D flip-flop DFF2 depends on the first logic signal, which is outputted from the first inverting output terminal QB1, received in the second clock terminal CLK2. After the first logic signal is changed from the low logic level (that is, logic "0") to the high logic level (that is, "1"), the second inverting output terminal QB2 outputs a second logic signal. The second logic signal outputted from the second inverting output terminal QB2 is transmitted to the second input terminal D2, so that a second logic state of the second input terminal D2 and the second output terminal Q2 is changed, and the second non-volatile memory element stores the second logic state.

In detail, when being pressed, the piezoelectric sensor 11 generates and transmits the voltage signal to the rectifier 12, and then the rectifier 12 rectifies the voltage signal to generate the trigger signal TRI, so that every time the piezoelectric sensor 11 generates the voltage signal, the first logic state of the first output terminal Q1 of the first non-volatile D flip-flop DFF1 is changed between logic "0" and logic "1", that is, the first logic state is changed from logic "0" to logic "1", or from logic "1" to logic "0" every time the piezoelectric sensor 11 is pressed. The second clock terminal CLK2 of the second non-volatile D flip-flop DFF2 receives the first logic signal outputted from the first inverting output terminal QB1, so the second non-volatile D flip-flop DFF2 changes the second logic state only when the first logic signal is changed from low logic level to high logic level. The logic level of the first logic signal outputted from the first inverting output terminal QB1 is changed between the high logic level and the low logic level repeatedly, as a result, a period of change of the second logic state of the second output terminal Q2 is two times of that of the first output terminal Q1. Table one show a relationship between the generation times of the voltage signal and the change of the logic states of terminals of the first non-volatile D flip-flop DFF1 and the second non-volatile D flip-flop DFF2.

TABLE ONE

| | Initial logic state | Logic state after the voltage signal is generated by one time | Logic state after the voltage signal is generated by two times | Logic state after the voltage signal is generated by three times |
|---|---|---|---|---|
| $Q_1$ | 0 | 1 | 0 | 1 |
| $QB_1$ | 1 | 0 | 1 | 0 |
| $Q_2$ | 0 | 0 | 1 | 1 |
| $QB_2$ | 1 | 1 | 0 | 0 |

The count data stored in the non-volatile counter 13 is formed b the first logic state and the second logic state which respectively represent different bits of the count data. In detail, the first logic state and the second logic state represent different bits of a binary number, the first logic state represents the first bit of the binary number, and the second logic state represents the second bit of the binary number. As shown in table one, after the voltage signal is generated by two times, the binary number of the count data is "10", that is, the first bit is "0" as represented by the first logic state (Q1), and the second bit is "1" as represented by the second logic state (Q2).

Aforementioned content describes the operation between the first non-volatile D flip-flop DFF1 and the second non-volatile D flip-flop DFF2 as an example for operation of the non-volatile counter 13. As described above, the non-volatile counter 13 having two non-volatile D flip-flops is able to record a number in a range of from 0 to 3, that is, the maximal number is $(2^2-1)$. Furthermore, when the non-volatile counter 13 includes n non-volatile D flip-flops DFF1 through DFFn connected in series, the non-volatile counter 13 is able to record a number in a range of 0 to $(2^n-1)$. Table two shows logic states of the output terminals and the inverting output terminals of non-volatile flip-flops, in a case that the non-volatile counter 13 includes three non-volatile D flip-flops. As shown in table two, a period of change of the logic state of the third output terminal Q3 is two times of that of the second output terminal Q2, and is also four ($2^2$) times of that of the first output terminal Q1. The non-volatile counter 13 including three non-volatile D flip-flops is able to the maximal value as 7 (that is, $2^3-1$), and the non-volatile counter 13 is reset to record zero when receiving the eighth trigger signal TRI.

TABLE TWO

| times | 0 | 1 | 2 | 3 | 4 | 5 | 6 | 7 | 8 |
|---|---|---|---|---|---|---|---|---|---|
| $Q_1$ | 0 | 1 | 0 | 1 | 0 | 1 | 0 | 1 | 0 |
| $QB_1$ | 1 | 0 | 1 | 0 | 1 | 0 | 1 | 0 | 1 |
| $Q_2$ | 0 | 0 | 1 | 1 | 0 | 0 | 1 | 1 | 0 |
| $QB_2$ | 1 | 1 | 0 | 0 | 1 | 1 | 0 | 0 | 1 |
| $Q_3$ | 0 | 0 | 0 | 0 | 1 | 1 | 1 | 1 | 0 |
| $QB_3$ | 1 | 1 | 1 | 1 | 0 | 0 | 0 | 0 | 1 |

Therefore, the number of the non-volatile D flip-flops disposed in the non-volatile counter may be determined on demand, for example, if the non-volatile counter includes more than twenty non-volatile D flip-flops, the maximal counting value of the non-volatile counter is 1,048,575.

The first logic state stored in the first non-volatile memory element is the same as the logic state of the first output terminal Q1, the second logic state stored in the second non-volatile memory element is the same as the logic state of the second output terminal Q2, and the non-volatile memory elements 330 of the other non-volatile D flip-flops connected in series have the same situation. For this reason, the processing module 14 may sequential read the logic states stored in the first non-volatile memory element, the second non-volatile memory element, and the non-volatile memory elements of the other non-volatile D flip-flops, in order to obtain the count data of the non-volatile counter 13. The processing module 14 combines the count data as a binary number and then convert the binary number to a decimal number.

To summarize, when being pressed, the piezoelectric sensor 11 generates and transmits the voltage signal to the rectifier 12, and the rectifier 12 then rectifies the voltage signal as the trigger signal TRI, the plurality of non-volatile D flip-flops DFF1 through DFFn are operated according to the trigger signal TRI and the non-volatile memory elements of the non-volatile D flip-flops DFF1 through DFFn store the logic states respectively, and the processing module 14 reads and converts the logic states to the decimal number as the counting value. The counting device 10 of the present disclosure may be used to record how many times the piezoelectric sensor 11 is pressed. The counting device 10 may be placed under a user's foot, for example, the counting device 10 may be placed in a shoe or on a sock, and the counting device 10 is able to count a number of steps every time the user steps on the piezoelectric sensor 11 during walking. However, this embodiment is merely for exemplary illustration, and the application filed of the counting device of the present disclosure is not limited thereto.

The following refers to FIG. 3 which shows other embodiment of the non-volatile D flip-flop of the present disclosure. The non-volatile D flip-flop DFF may include a logic memory circuit 310, a writing circuit 320, a non-volatile memory element 330, a reading circuit 340 and a control circuit 360.

As shown in FIG. 3, the control circuit 360 includes a NOT gate 361, a NAND gate 362, a NOT gate 363, a NOT gate 364, a NAND gate 365 and a NOT gate 366. An input terminal of the NOT gate 361 receives a first read signal RD from a previous stage circuit (such as a controller not shown in figured). An output terminal of the NOT gate 361 outputs a second read signal RDB to the logic memory circuit 310 and the reading circuit 340. The second read signal RDB is an inverting signal of the first read signal RD. A first input terminal of the NAND gate 362 receives an original clock signal CK from the front stage circuit. A second input terminal of the NAND gate 362 is electrically coupled to the output terminal of the NOT gate 361 and configured to receive a second read signal RDB. An output terminal of the NAND gate 362 outputs a dock signal CK1B to the logic memory circuit 310. An input terminal of the NOT gate 363 is electrically coupled to the output terminal of the NAND gate 362 and configured to receive the dock signal CK1B. An output terminal of the NOT gate 363 outputs the clock signal CK1 to the logic memory circuit 310. The dock signal CK1 is an inverting signal of the clock signal CK1B. An input terminal of the NOT gate 364 receives the original clock signal CK. A first input terminal of the NAND gate 365 is electrically coupled to the output terminal of the NOT gate 364. The second input terminal of the NAND gate 365 is electrically coupled to the output terminal of the NOT gate 361 and configured to receive the second read signal RDB. The output terminal of the NAND gate 365 outputs the clock signal CK0B to the logic memory circuit 310. An input terminal of the NOT gate 366 is coupled to the output terminal of the NAND gate 365 and configured to receive the clock signal CK0B. The output terminal of the NOT gate 366 outputs the clock signal CK0 to the logic memory circuit 310.

As shown in FIG. 3, the logic memory circuit 310 includes a NAND gate 711, a transmission gate 712, a NOT gate 713, a transmission gate 714, a transmission gate 715, a transmission gate 716, a NOR gate 717, a transmission gate 718, a NOT gate 719, a transmission gate 720, a transmission gate 721 and a NOT gate 722. A p-channel gate of the transmission gate 721 is controlled by the clock signal CK0B. An n-channel gate of the transmission gate 721 is controlled by the clock signal CK0. A first terminal of the transmission gate 721 is used as the input terminal D of the logic memory circuit 310. A second terminal of the transmission gate 721 is electrically coupled to a second input terminal of the NAND gate 711. A first input terminal of the NAND gate 711 receives a reset signal RB from the previous stage circuit (such as a controller not shown in figure). A first terminal of the transmission gate 712 is electrically coupled to an output terminal of the NAND gate 711. A p-channel gate of the transmission gate 712 is controlled by the first read signal RD. An n-channel gate of the transmission gate 712 is controlled by the second read signal RDB. During a normal operation period and a writing period, the transmission gate 712 is turned on. During a reading period, the transmission gate 712 is turned off. An input terminal of the NOT gate 713 is electrically coupled to the second terminal of the transmission gate 712. A first terminal of the transmission gate 714 is electrically coupled to an output terminal of the NOT gate 713. A second terminal of the transmission gate 714 is electrically coupled to a second input terminal of the NAND gate 711. A p-channel gate of the transmission gate 714 is controlled by the clock signal CK0. An n-channel gate of the transmission gate 714 is controlled by the clock signal CK0B.

A first terminal of the transmission gate 715 is electrically coupled to the output terminal of the NAND gate 711. An n-channel gate of the transmission gate 715 is controlled by the clock signal CK1. A p-channel gate of the transmission gate 715 is controlled by the clock signal CK1B. A first terminal of the transmission gate 716 is electrically coupled to the input terminal of the NOT gate 713. An n-channel gate of the transmission gate 716 is controlled by a first read signal RD. A p-channel gate of the transmission gate 716 is controlled by the second read signal RDB. During the normal operation period and the writing period, the transmission gate 716 is turned off; during the reading period, the transmission gate 716 is turned on. A first input terminal of the NOR gate 717 receives the reset signal R from the previous stage circuit (such as the controller not shown in figures). The reset signal R is an inverting signal of the reset signal RB. A second input terminal of the NOR gate 717 is coupled to a second terminal of the transmission gate 715. An input terminal of the NOT gate 722 is coupled to an output terminal of the NOR gate 717. An output terminal of the NOT gate 722 is used as an inverting output terminal QB of the logic memory circuit 310. The first terminal of the transmission gate 718 is coupled to the output terminal of the NOR gate 717, and a second terminal of the transmission gate 718 is coupled to an output terminal Q of the logic memory circuit 310. A p-channel gate of the transmission gate 718 is controlled by the first read signal RD. An n-channel gate of the transmission gate 718 is controlled by the second read signal RDB. During the normal operation period and the writing period, the transmission gate 718 is turned on; during the reading period, the transmission gate 718 is turned off. An input terminal of the NOT gate 719 is coupled to the second terminal of the transmission gate 718. A first terminal of the transmission gate 720 is coupled to an output terminal of the NOT gate 719. A second terminal of the transmission gate 720 is coupled to the second input terminal of the NOR gate 717 and a second terminal of the transmission gate 716. A p-channel gate of the transmission gate 720 is controlled by the clock signal CK1. An n-channel gate of the transmission gate 720 is controlled by the clock signal CK1B.

As shown in FIG. 3, the writing circuit 320 includes a first level shifter 321 and a second level shifter 322. An input terminal of the first level shifter 321 is coupled to the output terminal of the logic memory circuit 310. An output terminal of the first level shifter 321 is used as the second output terminal Q2 of the writing circuit 320, and is electrically coupled to the second terminal of the non-volatile memory element 330, such as a bottom electrode BE of the non-volatile memory element 330. An input terminal of the second level shifter 322 is electrically coupled to the inverting output terminal QB of the logic memory circuit 310. An output terminal of the second level shifter 322 is used as the first output terminal Q1 of the writing circuit 320 and is coupled to the first terminal of the non-volatile memory element 330, such as a top electrode TE of the non-volatile memory element 330.

It should be noted that implementation of the writing circuit 320 is not limited to the first level shifter 321 and the second level shifter 322. For example, in another embodiment, the writing circuit 320 may include a first buffer 323 and a second buffer 324. As shown in FIG. 3, an input terminal of the first buffer 323 is electrically coupled to the output terminal Q of the logic memory circuit 310; an output terminal of the first buffer 323 is used as the second output terminal Q2 of the writing circuit 320 and is electrically coupled to the second terminal of the non-volatile memory element 330, such as the bottom electrode BE. An input terminal of the second buffer 324 is electrically coupled to the inverting output terminal QB of the logic memory circuit 310. An output terminal of the second buffer 324 is used as the first output terminal Q1 of the writing circuit 320 and is electrically coupled to the first terminal of the non-volatile memory element 330, such as the top electrode TE.

As shown in FIG. 3, the reading circuit 340 includes a switch 341, a resistor 342, a switch 343 and a switch 344. A first terminal of the switch 341 is used as an output terminal of the reading circuit 340 and is electrically coupled to the output terminal Q of the logic memory circuit 310. A second terminal of the switch 341 is used as the first input terminal of the reading circuit 340 and is electrically coupled to the first terminal of the non-volatile memory element 330, such as the top electrode TE. A first terminal of the resistor 342 is coupled to the second terminal of the switch 341. A first terminal of the switch 343 is coupled to a second terminal of the resistor 342. A second terminal of the switch 343 is coupled to a system voltage supply VDD. A first terminal of the switch 344 is used as the second input terminal of the reading circuit 340 and is coupled to the second terminal of the non-volatile memory element 330, such as the bottom electrode BE. A second terminal of the switch 344 is coupled to a reference voltage supply, such as ground terminal GND.

Before the data storing process is performed (that is, the writing period), the output terminal Q of the logic memory circuit 310 is at high voltage level (such as logic "1"), and the inverting output terminal QB of the logic memory circuit 310 is logic "0". Before the system enters a standby state or a shutdown state (that is, the system is powered off), the non-volatile D flip-flop DFF performs the data storing process (that is, the writing period) to record data or logic state of the logic memory circuit 310 in the non-volatile memory element 330. During the writing period, the write signal WR is pulled up to the high voltage level (such as logic "1"), to enable the first buffer 323 to convert the signal (that is, logic "1") of the output terminal Q to a high write voltage (such as a forming voltage $V_{FW}$), and to enable the second buffer 324 to convert the signal (that is, the logic "0") of the inverting output terminal QB to a low write voltage (such as ground voltage GND). At this time, current provided by the first buffer 323 flows from the bottom electrode BE of the non-volatile memory element 330 to the top electrode TE of the non-volatile memory element 330, so that a resistance state of the non-volatile memory element 330 is reset to the high resistance state.

After the data storing process is completed (that is, the writing period is ended), the non-volatile D flip-flop DFF may be powered off without losing the data. During the power-off period, the system does not supply power to the logic memory circuit 310, the writing circuit 320 and the reading circuit 340, and the non-volatile flip-flop DFF has entered the standby or shutdown state, whereby the power consumption of these circuits may be reduced effectively.

After the power-off period is ended, the system supplies power to the logic memory circuit 310, the writing circuit 320 and the reading circuit 340, and the non-volatile D flip-flop DFF performs a restoring process (that is, the reading period is started) to write the data stored in the non-volatile memory element 330 back to the logic memory circuit 310. In the restoring process, the read signal RD is pulled up to the high voltage level, such as the logic "1", to turn on the switch 341, the switch 343 and the switch 344. Because of the high resistance state (which is equivalent to the logic "1") of the non-volatile memory element 330, the voltage of the output terminal Q of the logic memory circuit 310 is pulled up, and the inverting output terminal QB of the logic memory circuit 310 is at low voltage level which is equivalent to the logic "0". After the reading period is ended, the signal of the output terminal Q of the logic memory circuit 310 is back to the logic "1", and the signal of the inverting output terminal QB is back to the logic "0". As a result, when the non-volatile D flip-flops are connected by the above-mentioned way, the non-volatile D flip-flops can provide the counting function.

Furthermore, as shown in FIG. 2, the non-volatile counter 13 may include a read-write control unit 131, and the rectifier 12 may include a BOR circuit. The first non-volatile D flip-flop DFF1 may include a first read terminal RD1 and a first write terminal WR1, and the second non-volatile D flip-flop DFF2 may include a second read terminal RD2 and a second write terminal WR2.

The read-write control unit 131 generates a read signal RD and a write signal WR according to a BOR signal from the BOR circuit, and the read signal RD is transmitted to the first read terminal RD1 and the second read terminal RD2. Because of the characteristic of the non-volatile D flip-flop DFF, the read signal RD changes the logic state of the first output terminal Q1 to the first logic state stored in the first non-volatile memory element, and changes the logic state of the second output terminal Q2 to the second logic state stored in the second non-volatile memory element. When the write signal WR is transmitted to the first write terminal and the second write terminal, the first non-volatile memory element is driven to store the first logic state of the first output terminal Q1 and the second non-volatile memory element is driven to store the second logic state of the second output terminal Q2.

In detail, after the rectifier 12 transmits the trigger signal TRI to the first non-volatile D flip-flop DFF1, the BOR circuit also transmits the BOR signal to the read-write control unit 131, and at this time, the read-write control unit 131 generates and outputs the read signal RD to the first read terminal RD1 and the second read terminal RD2, so that the logic state of the first output terminal Q1 is changed to the first logic state stored in the first non-volatile memory element, and the logic state of the second output terminal Q2 is changed to the second logic state stored in the second non-volatile memory element, and as a result, the first non-volatile D flip-flop DFF1 and the second non-volatile D flip-flop DFF2 are then operated according to the restored logic states. When the trigger signal TRI comes to an end, the read-write control unit 131 generates and transmits the write signal to the first write terminal and the second write terminal according to the BOR signal, to enable the first non-volatile memory element to store the first logic state of the first output terminal Q1 at the time, and enable the second non-volatile memory element to store the second logic state of the second output terminal Q2 at the time. As a result, upon receipt of next trigger signal TRI, the first non-volatile D flip-flop DFF1 and the second non-volatile D flip-flop DFF2 will be restored to the previously-stored logic state again. As a result, every time the non-volatile counter 13 receives the trigger signal TRI to operate, each of the non-volatile D flip-flops DFF1-DFFn of the non-volatile counter 13 performs the read-write process and store the logic state, thereby accumulating the count data.

Furthermore, in order to read the count data, the processing module 14 inputs signals to the read terminals of the non-volatile D flip-flops DFF1-DFFn, to restore the logic states of the output terminal of the non-volatile D flip-flops DFF1-DFFn to the logic state stored in the non-volatile memory elements. And the processing module 14 then receives the signal outputted from the output terminals to obtain the logic states stored in the non-volatile D flip-flops DFF1-DFFn. Next, the processing module 14 converts all bits, which are respectively represented by the non-volatile D flip-flops DFF1-DFFn, into the counting value.

Each of the non-volatile D flip-flops DFF1-DFFn may include a reset terminal, and the processing module 14 may respectively transmit reset signals to the reset terminals RB1-RBn to reset the non-volatile memory elements of the non-volatile D flip-flops to the initial state thereof.

In order to read the count data of the counting device 10, the user may control an external device 90 to transmit a control signal to the processing module 14 through the wireless communication module 15, and the processing module 14 is triggered to read the count data of the non-volatile counter 13, calculate the count data to obtain the counting value, and then transmit the counting value to the external device 90. In order to reset the counting device 10 (that is, the count value is set to zero), the user may transmit other control signal to the processing module 14 by above-mentioned manner, thereby controlling the processing module 14 to reset the non-volatile counter 13.

Figure 4:
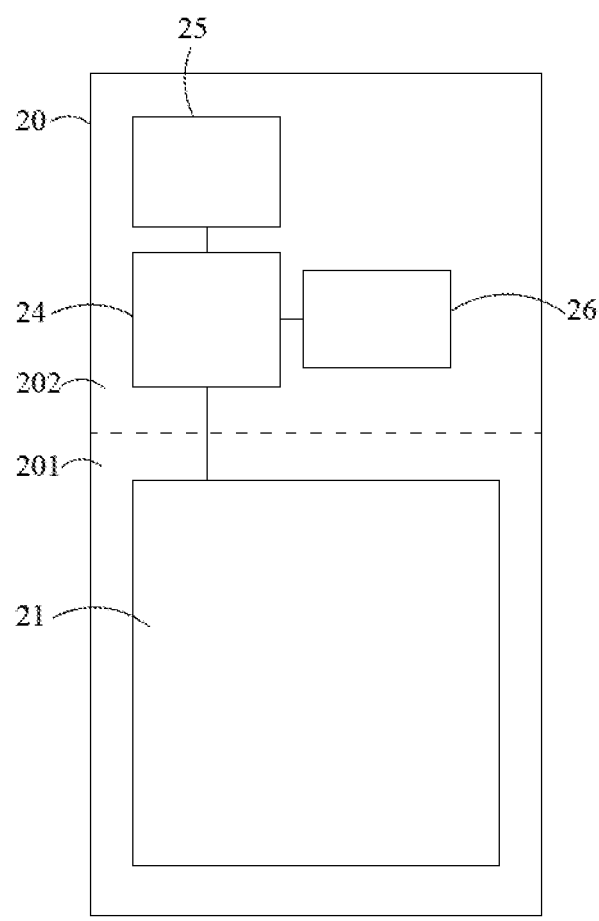
FIG. 4 is a block diagram of an embodiment of a pedometer device of the present disclosure.

The following refers to FIG. 4, which is a schematic view of an embodiment of the pedometer device of the present disclosure. The pedometer device 20 includes a tread portion 201 and an accommodation portion 202. The tread portion 201 is in a sheet-like structure, and includes a piezoelectric sensor 21 which may generate a voltage signal while being pressed.

The accommodation portion 202 is also in a sheet-like structure and connected with the tread portion 201. The accommodation portion 202 includes a processing module 24, a memory and a wireless communication module 25. The processing module 24 is electrically coupled to the piezoelectric sensor 21 to receive the voltage signal. Upon receipt of the voltage signal, the processing module 24 increases the counting value by one; that is, when the piezoelectric sensor is pressed to generate and transmit the voltage signal to the processing module 24, the processing module 24 increases the counting value by one and stores the counting value in the memory. The processing module 24 is electrically coupled to the wireless communication module 25 and transmits the counting value to the external device through the wireless communication module 25.

The pedometer device 20 of the present disclosure may be placed in a shoe. The tread portion 201 and the accommodation portion 202 both are placed inside the shoe, the tread portion 201 is disposed in a position corresponding to a heel portion of the shoe, and the accommodation portion 202 is placed in a position corresponding to a foot arch portion of the shoe. Alternatively, the pedometer device 20 may be fixed on a sock, that is, the tread portion 201 and the accommodation portion 202 both are fixed on the sock. Preferably, the tread portion 201 is placed in a position corresponding to a heel portion of the sock, and the accommodation portion 202 is placed in a position corresponding to a foot arch portion of the sock. The pedometer device 20 may be fixed on the sock by an adhesive manner or a Velcro, so that the user may remove the pedometer device 20 from the shoe or the sock on demand.

Under a condition that the pedometer device 20 is fixed in the shoe or on the sock, while the user is walking, the user's heel steps the piezoelectric sensor 21 of the tread portion 201, to force the piezoelectric sensor 21 to generate the voltage signal to the processing module 24, and the processing module 24 then increases the counting value upon receipt of the voltage signal and stores the counting value in the memory. The processing module 24, the memory and the wireless communication module 25, which are easily damaged when subjected to pressure, are disposed in the accommodation portion 20, so the accommodation portion 202 is placed at the foot arch portion of the shoe or sock, an area under minimal or no tread pressure while the user walks.

The processing module 24 and the wireless communication module wireless communication module of this embodiment may be similar to the processing module 24 and the wireless communication module 25 of the counting device 10 in previous content.

Therefore, the pedometer device 20 of the present disclosure may be detachably attached on the shoe or the sock to count a number of steps without being integrally formed with the shoe or the sock, whereby a range of application of the pedometer device 20 is widened. Furthermore, the pedometer device 20 may be produced in different size to meet different user's foot.

Figure 5:
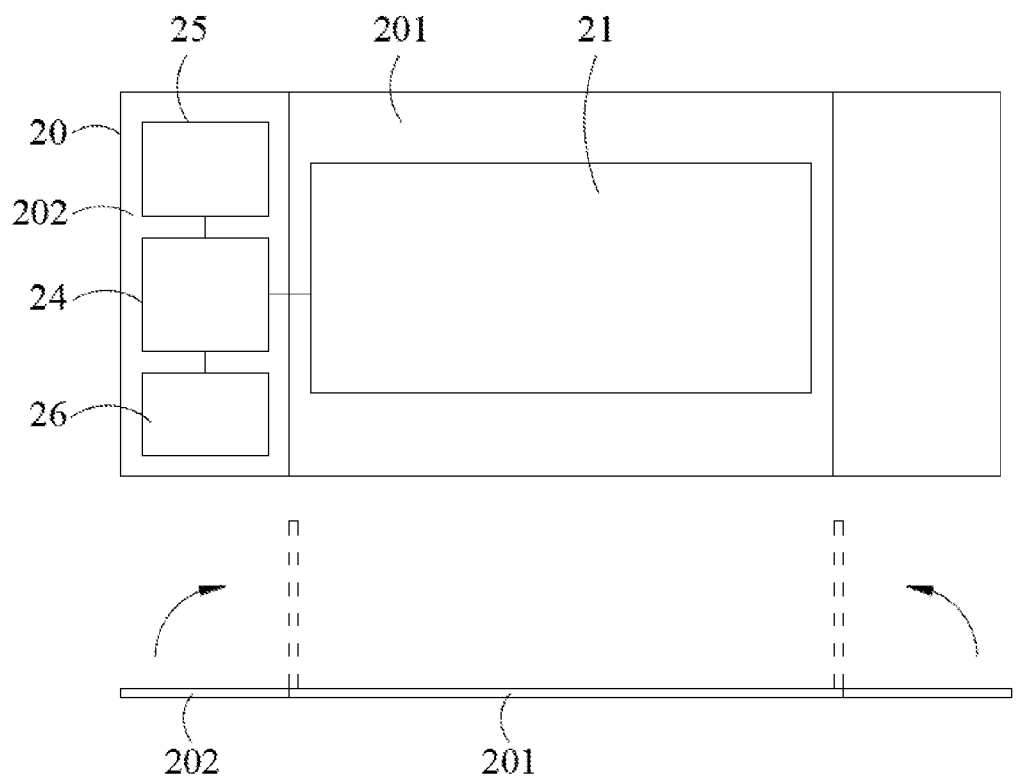
FIG. 5 is a block diagram of an embodiment of the pedometer device of the present disclosure.

The following refers to FIG. 5, which is a schematic view of alternative embodiment of the pedometer device of the present disclosure. In this embodiment, the pedometer device 20 of the present disclosure also includes the tread portion 201 and the accommodation portion 202, so their detailed descriptions are not repeated.

In this embodiment, the pedometer device 20 of the present disclosure may be disposed in the shoe, that is, the tread portion 201 and the accommodation portion 202 both are disposed inside the shoe, the tread portion 201 is disposed at the heel portion of the shoe, and the accommodation portion is bendably connected to the tread portion 201, and the accommodation portion 202 is bent upwardly relative to a sole of the shoe and disposed on an inner lateral side of the shoe. When the user wears the shoe to walk, the tread portion 201 is trod on by the user's heel at each step during walking, and the accommodation portion 202 is not.

Alternatively, the pedometer device 20 may be fixed on the sock, that is, the tread portion 201 and the accommodation portion 202 are both fixed on the sock, and the tread portion 201 is placed at the heel portion of the sock. The accommodation portion 202 is bendably connected to the tread portion, so that the accommodation portion 202 is bent upwardly relative to a bottom of the sock and attached to a lateral side of the sock. As a result, while the user is walking, the tread portion 201 is continuously pressed by the user's heel, but the accommodation portion 202 is not.

Figure 6:
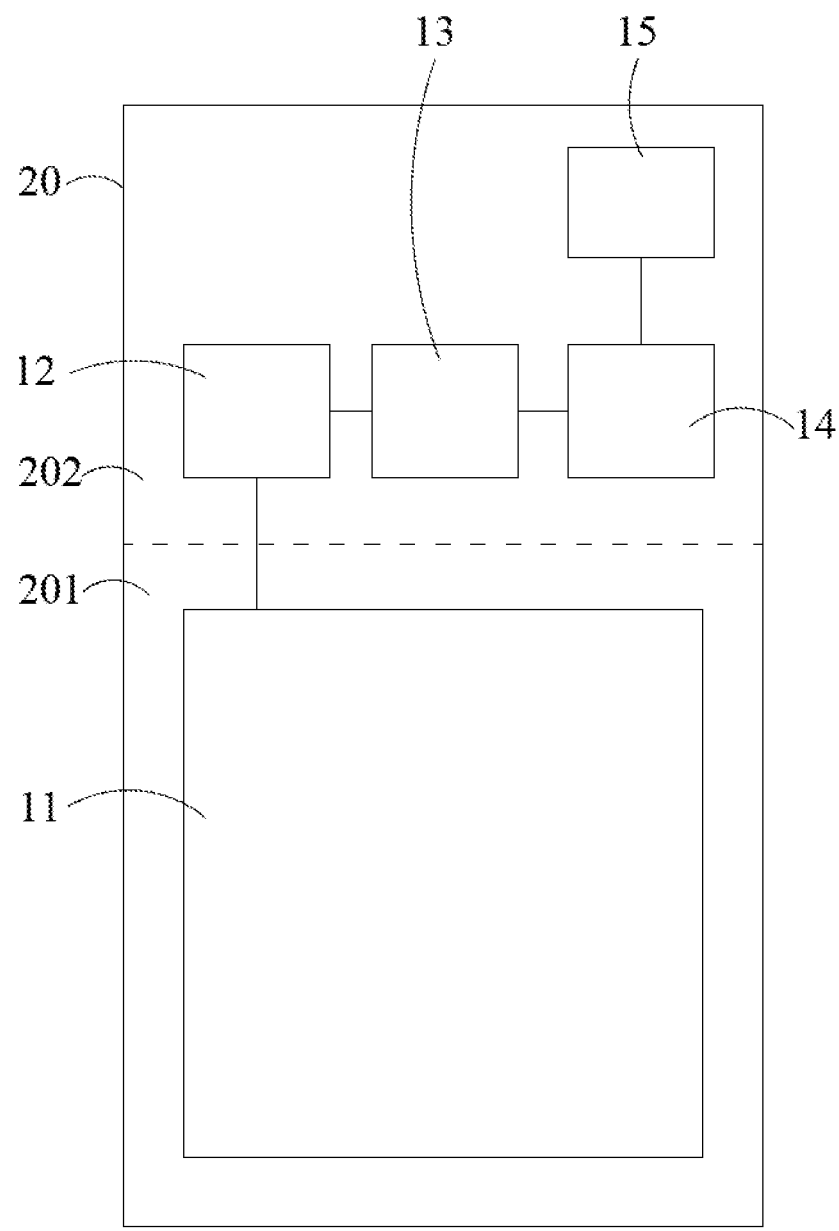
FIG. 6 is a block diagram of an embodiment of the pedometer device of the present disclosure.
Figure 7:
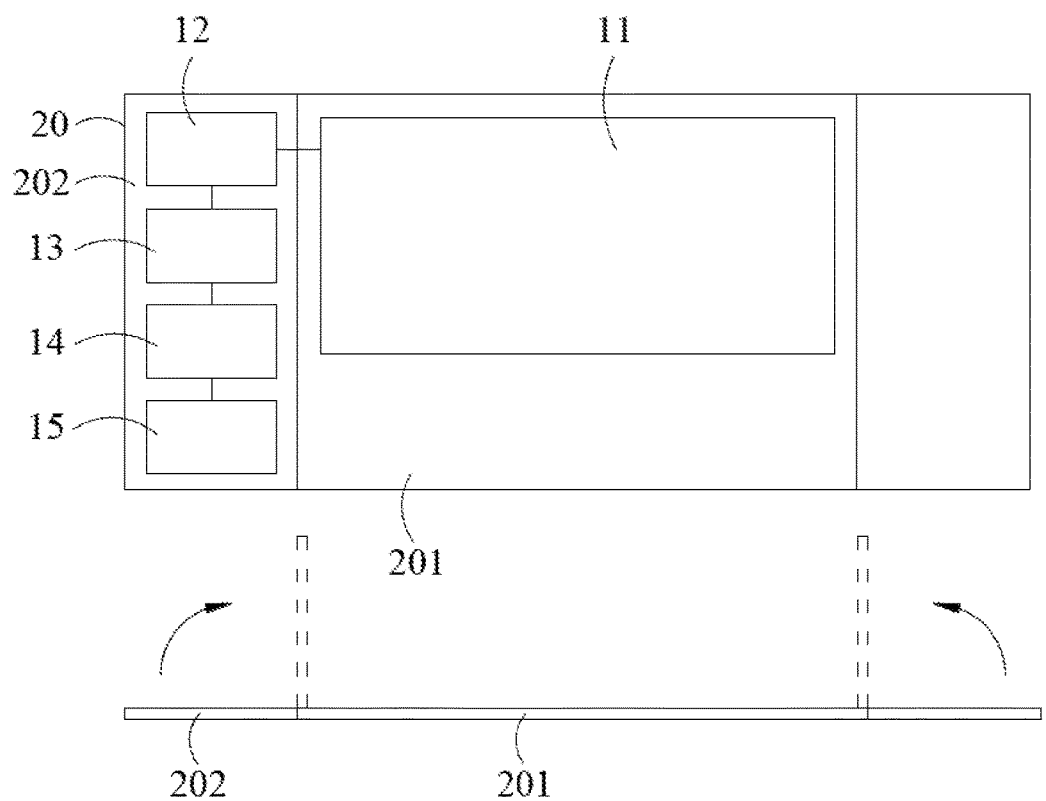
FIG. 7 is a block diagram of an embodiment of the pedometer device of the present disclosure.

The following refers to FIGS. 6 and 7, which are schematic views of other embodiments of the pedometer device of the present disclosure. As shown in FIGS. 6 and 7, the sheet-like pedometer device 20 may include the counting device 10. The rectifier 12, the non-volatile counter 13, the processing module 14 and the wireless communication module 15 of the counting device 10 are disposed in the accommodation portion 202, and the piezoelectric sensor 11 of the counting device 10 is disposed in the tread portion 201. As a result, the counting device 10 may be applicable to the pedometer device 20.

The pedometer devices 20 of the counting device 10 may be placed in the left and right shoes, respectively. When the user wears the shoes to walk, the piezoelectric sensors 11 are pressed separately in every step, so that one of the non-volatile counters 13 increases the count data by one. When the user stops walking or takes off the shoes, the non-volatile counters 13 are not provided with power but still retains the number of steps, so that the pedometer device 20 is able to provide the user with the counting function. In order to obtain the number of steps recorded in the pedometer device 20 or reset the pedometer device 20, the user may use the external device to control the processing module 14 through the wireless communication module 15, no matter the pedometer device 20 is attached on the sock or placed in the shoe. Therefore, due to detachable disposal and low power consumption of the pedometer device 20 of the present disclosure, it is convenient for the user to use the pedometer device 20 of the present disclosure in practice.

To summarize, the counting device and the pedometer device of the present disclosure uses the piezoelectric sensor to generate the voltage signal to the plurality of non-volatile D flip-flops when the piezoelectric sensor is pressed, the logic states of the non-volatile D flip-flops are changed in response to the voltage signal, and are further retained in the non-volatile memory elements of the non-volatile D flip-flops when not being supplied power, so that the counting data can be continuously accumulated, and the pedometer device just consumes low power and can be implemented without a battery; furthermore, the pedometer device of the present disclosure is in a sheet-like and bendable structure, so the pedometer device may be detachably disposed, on the sock or in the shoe, and does not need to be integrally formed with the shoe.

The present disclosure disclosed herein has been described by means of specific embodiments. However, numerous modifications, variations and enhancements can be made thereto by those skilled in the art without departing from the spirit and scope of the invention set forth in the claims.

What is claimed is:

1. A counting device, comprising:
   a piezoelectric sensor, configured to generate a voltage signal when being pressed;
   a rectifier, electrically coupled to the piezoelectric sensor and configured to receive the voltage signal and rectify the voltage signal to a trigger signal;
   a non-volatile counter, electrically coupled to the rectifier and configured to receive the trigger signal, and comprising a plurality of non-volatile D flip-flops which are configured to count according to the trigger signal and store count data, wherein each non-volatile D flip-flop is configured to store the count data and retains a logic state of the count data without consuming power;
   a processing module, electrically coupled to the non-volatile counter and configured to read the count data and calculate the count data to generate a counting value; and
   a wireless communication module, electrically coupled to the processing module, wherein the processing module transmits the counting value to an external device through the wireless communication module;
   wherein the counting device is powered with electrical energy of the voltage signal generated by the piezoelectric sensor; and
   the plurality of non-volatile D flip-flops comprise:
   a first non-volatile D flip-flop, comprising a first clock terminal, a first input terminal, a first output terminal, a first inverting output terminal and a first non-volatile memory element, wherein the first clock terminal is electrically coupled to the rectifier, and the first inverting output terminal is electrically coupled to the first input terminal; and
   a second non-volatile D flip-flop, comprising a second clock terminal, a second input terminal, a second output terminal, a second inverting output terminal and a second non-volatile memory element, wherein the second clock terminal is electrically coupled to the first inverting output terminal, and the second inverting output terminal is electrically coupled to the second input terminal;
   wherein the first clock terminal receives the trigger signal, a first logic signal outputted from the first inverting output terminal is transmitted to the first input terminal and the second clock terminal, so that a first logic state of the first output terminal is changed correspondingly, and the first non-volatile memory element stores the first logic state;
   wherein the operation of the second non-volatile D flip-flop is determined according to the first logic signal outputted from the first inverting output terminal, and when the first logic signal is changed from a low logic level to a high logic level, the second inverting output terminal outputs a second logic signal which is then transmitted to the second input terminal, so that a second logic state of the second output terminal is changed and the second non-volatile memory element stores the second logic state.

2. The counting device according to claim 1, wherein the count data is formed by the first logic state and the second logic state which represent different bits of the count data respectively.

3. The counting device according to claim 1, wherein the non-volatile counter further comprises a read-write control unit, and the rectifier further comprises a BOR circuit, and the first non-volatile D flip-flop further comprises a first read terminal and a first write terminal, and the second non-volatile D flip-flop further comprises a second read terminal and a second write terminal, the read-write control unit generates a read signal and a write signal according to a BOR signal from the BOR circuit, and the read signal is transmitted to the first read terminal and the second read terminal, so that the first output terminal is set to the first logic state stored in the first non-volatile memory element, and the second output terminal is set to the second logic state stored in the second non-volatile memory element;
   wherein the write signal is transmitted to the first write terminal and the second write terminal causing the first non-volatile memory element to store the first logic state of the first output terminal, and control the second non-volatile memory element to store the second logic state of the second output terminal.

4. The counting device according to claim 1, wherein the first non-volatile D flip-flop further comprises a first reset terminal and the second non-volatile D flip-flop further comprises a second reset terminal, and the processing module transmits a reset signal to the first reset terminal and the second reset terminal to reset the first logic state and the second logic state.

5. The counting device according to claim 1, further comprising a wireless communication module electrically coupled to the processing module and configured to transmit the counting value to an external device.

6. A pedometer device, comprising:
   a tread portion in a sheet-like structure and comprising a piezoelectric sensor which is configured to generate a voltage signal when pressed;
   an accommodation portion in a sheet-like structure and connected with the tread portion, and comprising a rectifier, a non-volatile counter, a processing module and a wireless communication module, wherein the rectifier is electrically coupled to the piezoelectric sensor and configured to receive the voltage signal and rectify the voltage signal to a trigger signal; the non-volatile counter is electrically coupled to the rectifier and configured to receive the trigger signal; the non-volatile counter comprises a plurality of non-volatile D flip-flops which are configured to count according to the trigger signal and store count data; the processing module is electrically coupled to the non-volatile counter and configured to read the count data and calculate the count data to generate a counting value; the wireless communication module is electrically coupled to the processing module; wherein the processing module transmits the counting value to an external device through the wireless communication module;
   wherein each non-volatile D flip-flop is configured to store the count data and retains a logic state of the count data without consuming power; and
   the plurality of non-volatile D flip-flops comprise:
   a first non-volatile D flip-flop, comprising a first clock terminal, a first input terminal, a first output terminal, a first inverting output terminal and a first non-volatile memory element, wherein the first clock terminal is electrically coupled to the rectifier, and the first inverting output terminal is electrically coupled to the first input terminal; and
   a second non-volatile D flip-flop, comprising a second clock terminal, a second input terminal, a second output terminal, a second inverting output terminal and a second non-volatile memory element, wherein the second clock terminal is electrically coupled to the first inverting output terminal, and the second inverting output terminal is electrically coupled to the second input terminal;

wherein the first clock terminal receives the trigger signal, a first logic signal outputted from the first inverting output terminal is transmitted to the first input terminal and the second clock terminal, so that a first logic state of the first output terminal is changed correspondingly, and the first non-volatile memory element stores the first logic state;

wherein the operation of the second non-volatile D flip-flop is determined according to the first logic signal outputted from the first inverting output terminal, and when the first logic signal is changed from a low logic level to a high logic level, the second inverting output terminal outputs a second logic signal which is then transmitted to the second input terminal, so that a second logic state of the second output terminal is changed and the second non-volatile memory element stores the second logic state.

7. The pedometer device according to claim 6, wherein the tread portion and the accommodation portion are disposed inside a shoe, and the tread portion is disposed in a position corresponding to a heel portion of the shoe, and the accommodation portion is bendably connected to the tread portion, and is bent upwardly relative to a sole of the shoe when being disposed on an inner lateral side of the shoe.

8. The pedometer device according to claim 6, wherein the tread portion and the accommodation portion are disposed in a shoe, the tread portion is disposed in a position corresponding to a heel portion of the shoe, and the accommodation portion is disposed in a position corresponding to a foot arch portion of the shoe.

9. The pedometer device according to claim 6, wherein the tread portion and the accommodation portion are fixed on a sock, the tread portion is fixed on a heel portion of the sock, and the accommodation portion is bendably connected to the tread portion, and is bent upwardly relative to a bottom of the sock and fixed on a lateral side of the sock.

10. The pedometer device according to claim 6, wherein the tread portion and the accommodation portion are fixed on a sock, and the tread portion is fixed on a heel portion of the sock and the accommodation portion is fixed on a foot arch portion of the sock.

* * * * *